United States Patent [19]

Koutalides

[11] 4,099,200
[45] Jul. 4, 1978

[54] PACKAGE FOR SEMICONDUCTOR BEAM LEAD DEVICES

[75] Inventor: Andrew Koutalides, Cupertino, Calif.

[73] Assignee: Raytheon Company, Lexington, Mass.

[21] Appl. No.: 751,496

[22] Filed: Dec. 17, 1976

Related U.S. Application Data

[63] Continuation of Ser. No. 670,927, Mar. 26, 1976, abandoned, which is a continuation of Ser. No. 554,795, Mar. 3, 1975, abandoned, which is a continuation of Ser. No. 421,004, Dec. 3, 1973, abandoned.

[51] Int. Cl.² .................... H01L 23/48; H01L 29/44; H01L 29/52
[52] U.S. Cl. ........................ 357/69; 357/70; 357/74; 357/80; 174/52 S; 174/50.61
[58] Field of Search .............. 357/69, 70, 72, 74, 357/80; 174/52 S, 50.61

[56] References Cited

U.S. PATENT DOCUMENTS

| 3,436,810 | 4/1968 | Kauffman | 357/69 |
| 3,594,619 | 7/1971 | Kamoshida | 357/69 |
| 3,672,034 | 6/1972 | Clark | 357/70 |
| 3,857,993 | 12/1974 | Gregory | 357/69 |
| 3,869,787 | 3/1975 | Umbach | 357/69 |

FOREIGN PATENT DOCUMENTS

| 31,674 | 8/1972 | Japan | 357/69 |

*Primary Examiner*—Andrew J. James
*Attorney, Agent, or Firm*—Richard M. Sharkansky; Joseph D. Pannone; Milton D. Bartlett

[57] ABSTRACT

A beam lead packaged semiconductor structure having the beam leads of the beam lead semiconductor chip bonded directly to the thinned coplanar tips of lead frame leads which are supported on, and bonded to, an insulating support forming a portion of the package envelope and having substantially the same thermal coefficient expansion as the lead frame metal. The package is constructed by producing thinned coplanar lead tips integral with a lead frame structure, bonding each lead of a beam lead device to a thinned tip of a lead frame lead at a plurality of points, bonding ceramic covers of the package to both sides of the lead frame beam lead device to hermetically seal the package, with one cover being bonded to the thinned tips beneath the regions where the beam leads of the semiconductor chip are bonded to the thinned tips of the lead frame lead to rigidly support the chip in the package and then removing the lead frame from the outer ends of the lead frame leads and forming the outer portions of said leads to fit the desired socket configuration.

5 Claims, 4 Drawing Figures

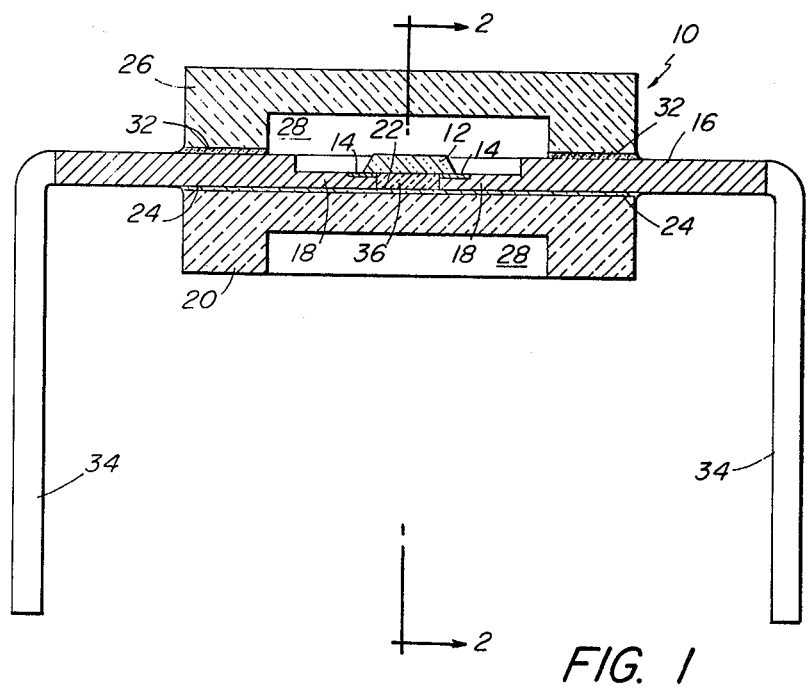
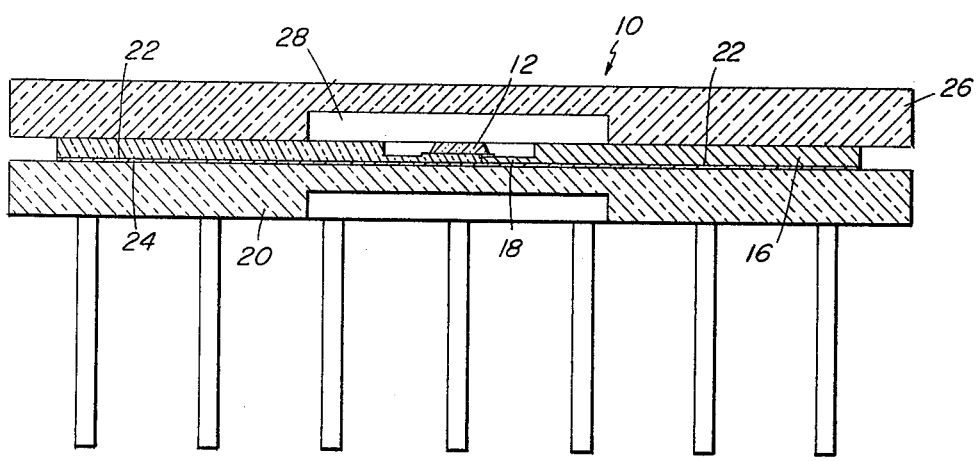

PACKAGE FOR SEMICONDUCTOR BEAM LEAD DEVICES

CROSS-REFERENCE TO RELATED CASES

This is a continuation of application Ser. No. 670,927, filed Mar. 26, 1976 which is a continuation of application Ser. No. 554,795, filed Mar. 3, 1975 which is a continuation of application Ser. No. 421,004 filed Dec. 3, 1973, now abandoned.

BACKGROUND OF THE INVENTION

Beam lead devices in which one or more semiconductor elements are formed on one surface of a semiconductor chip with leads for the circuits extending outwardly beyond the edges of the chip are desirable for many applications because of their reliability, packing density, heat dissipation capability and ability to operate over a wide range of temperatures and pressures. In order to reliably connect the beam leads to external circuitry, it has been found essential that the beam leads match the lead device to which they are connected in planarity to a tolerance preferably less than one thousandth of an inch. Otherwise, one or more of the beam leads will have stresses applied thereto, particularly when the chip is supported substantially entirely from the beam leads which results in either cracking at the edge of the semiconductor chip or failure of the bond to the lead.

Heretofore it has generally been necessary for reliable results to form a substrate of rigid material on which a pattern of leads was rigidly positioned with lead regions matching the positions of the beams of the semiconductor chip. The beam lead semiconductor device was then positioned with the beams contacting the lead pattern regions, and the beams were bonded to the lead pattern regions by a bonding system employing relatively low temperature and substantial pressure. Such a support with the lead pattern formed thereon, which was relatively expensive, could then be packaged with contacts made to a lead frame of the package, either by a plurality of wires each individually thermal compression bonded or by soldering a lead frame directly to the lead on the support. Such a dual step operation resulted in two or more bonds for each lead-out from each beam lead on the semiconductor chip, thereby increasing the probability of a bond failure.

SUMMARY OF THE INVENTION

In accordance with this invention, a lead frame structure and support is provided in which the inwardly extending tips of the lead frame, which are made coplanar and thinned, are bonded directly to the beam leads of a semiconductor chip. Preferably, the thinned ends of the lead frame are sufficiently thinner than the other portions of the lead frame whereby the major portions of the lead frame are thick enough to provide stable geometry during the bonding process when the beam lead is forced against the thinned lead frame end portion with sufficient pressure to deform the beam lead without substantial lateral movement of the thinned end by twisting or otherwise so that a good bond may be achieved.

In addition, this invention discloses that the lead frame leads are bonded to the insulating covers of the package by a material having substantially the same coefficient of expansion as the lead frame so that the device will function over a wide range of temperatures without producing undue stresses between the lead frame leads and their support.

This invention further discloses that the thinned ends of the lead frame leads, which can be formed by etching or coining the lead frame metal, are preferably bonded to one of the insulating covers so that the relatively delicate ends of the lead frame can rigidly support the semiconductor chip in the package substantially entirely through the beam leads in the lead bonding regions.

BRIEF DESCRIPTION OF THE DRAWINGS

Other and further objects and advantages of this invention will be apparent as the description thereof progresses, reference being had to the accompanying drawings wherein:

FIG. 1 illustrates a vertical sectional view of a semiconductor package showing a beam lead semiconductor device directly bonded to lead frame leads;

FIG. 2 illustrates a vertical sectional view of the structure shown in FIG. 1 taken along line 2—2 of FIG. 1;

DESCRIPTION OF THE PREFERRED EMBODIMENT OF THE INVENTION

Figure 4:
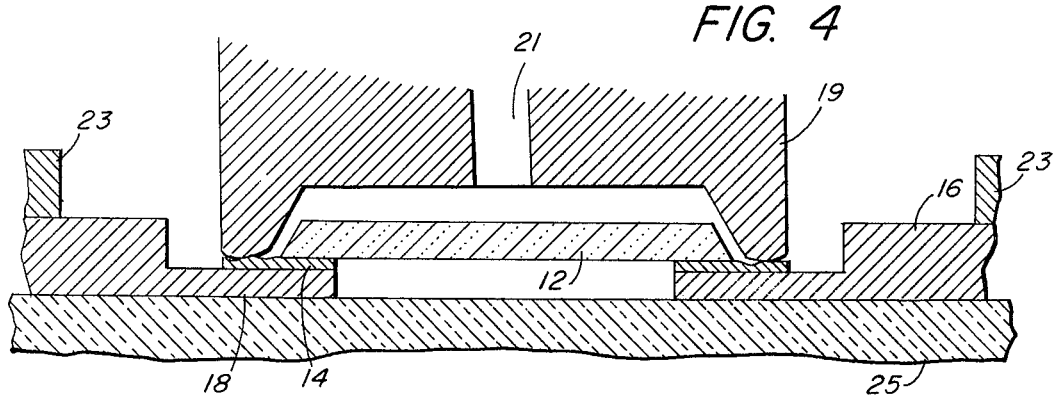
FIG. 4 illustrates a sectional view of a portion of the structure of FIG. 3 taken along line 4—4 of FIG. 3.
Figure 3:
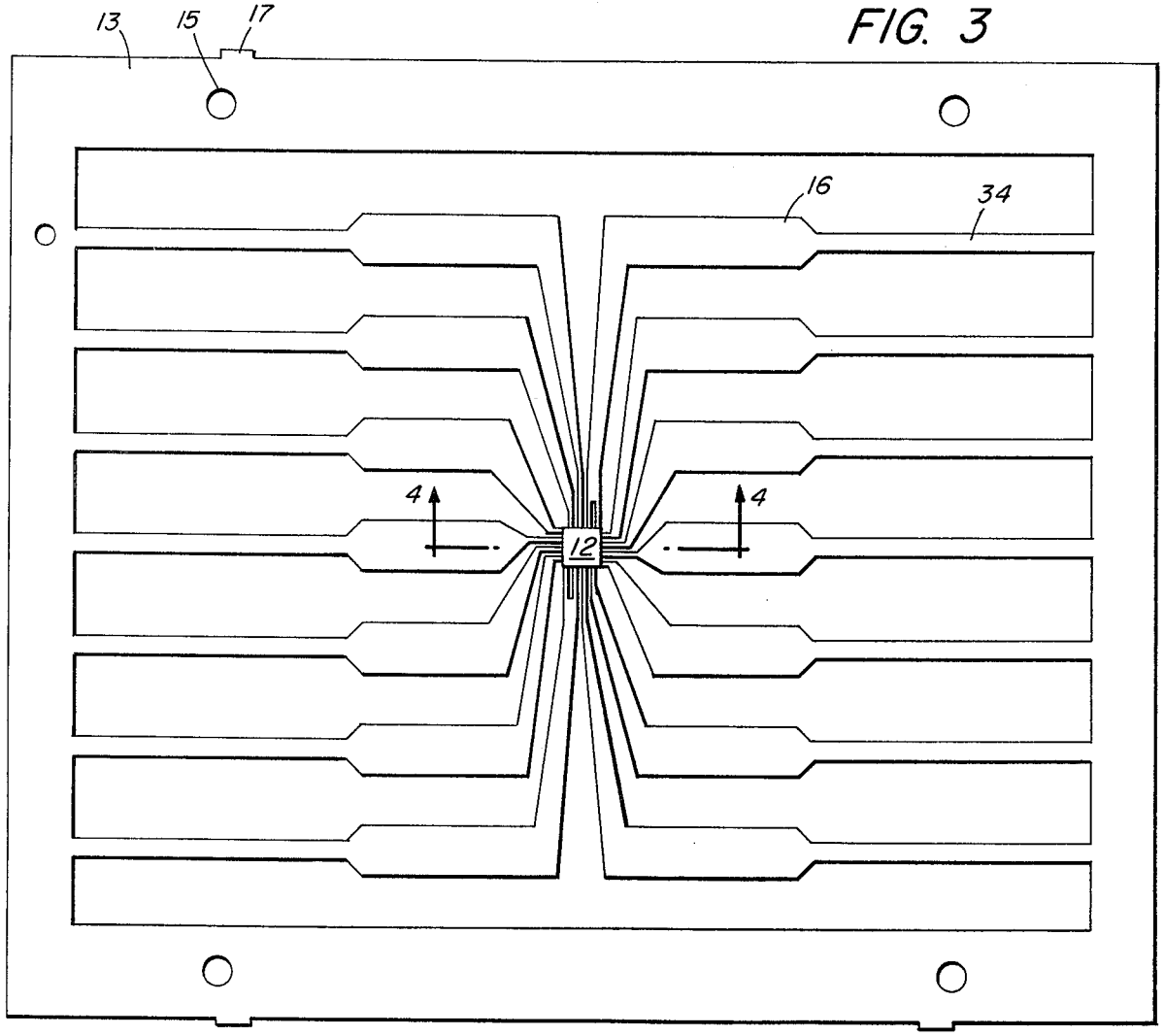
FIG. 3 illustrates a plan view of a lead frame with a beam lead semiconductor chip bonded directly thereto through the beam leads prior to assembly in the package of FIGS. 1 and 2.

Referring now to FIGS. 1 through 4, there is shown a package 10 surrounding a beam lead semiconductor device 12 which may be an integrated circuit or a discrete semiconductor device. In general, the preferred form of the invention contemplates a substantial number of leads extending out through the walls of the package and, hence, the package is suitable for any size integrated circuit.

A plurality of beam leads 14 extending from the edges of the integrated circuit 12 are bonded with pressure and heat to the ends of individual lead frame members 16 at thin portions 18 thereof. The end portions 18 have been thinned so that their thickness is substantially the same as their width to facilitate bonding to beam leads 14 since, if they were made much thicker than their width, they might tend to twist or move sidewise under bonding pressure which is preferably sufficient to cause deformation of the beam leads, which could cause misalignment of the beams 14 with the leads 16.

The leads 16 are bonded to lower package cover 20 which is preferably ceramic and has a flat upper surface 22. Leads 16 are bonded to ceramic cover 20 by a thin layer of glass 24. The upper surfaces of the thinned regions 18 of the leads 16 are preferably coplanar with a tolerance of approximately 0.001 inches or less so that during the bonding process, pressure is substantially equalized between each of the beam leads and thinned portions 18 of the lead frame leads 16.

An upper ceramic cover 26 is bonded to the lead frame leads 16 by a layer of glass 32 which hermetically seals the package by contacting glass layer 24 between the leads 16 around the periphery of the package. By using a depression 28 in the lower surface of cover 20 which is the same as the space 28 beneath upper cover 26, the same part may be used for both upper and lower covers 26 and 20.

The outward ends of the leads 16 are formed to any desired configuration such as the downwardly extending projection 34 which is easily inserted into an integrated circuit socket.

While a large portion of the heat generated in the integrated circuit 12 is conducted via the beams 14 and the leads 24 to the heat sink formed by the package covers 20 and 26, additional heat transfer may be obtained, if desired, by filling the space between the semiconductor chip 12 and the support 20 with a heat transfer insulating material such as silicone grease 36.

It should be noted that since the thinned ends 18 of the leads 16, which extend under the edges of the chip 12, are rigidly bonded via the glass layer 24 to the cover 20, the regions provide substantially direct support to the chip 12 and, hence, render the overall structure extremely rigid and resistant to vibration or mechanical shock. In addition, by making thermal coefficient of expansion of the glass layer 24 and the metal leads 16 substantially equal to the thermal coefficient of expansion of the ceramic support 20, the entire structure will expand and contract with relatively low stresses over a wide range of temperatures, thereby reducing the probability of failure of the bonds or cracking of the chip 12 for this reason.

An example of materials which are useful for such a structure is as follows: covers 26 and 20 are formed of a high percentage of aluminum, for example 94 to 96 percent $Al_2O_3$ having a thermal conductivity of 0.035 calories per second per square centimeter degree centigrade per centimeter, a high resistance at temperatures up to 500° C, a thermal coefficient of expansion at 25° to 200° C of $6 \times 10^{-6}$ per degree centigrade and between 200° and 500° C of $7 \times 10^{-6}$ per degree centigrade, and a modulus of elasticity of $41 \times 10^6$ psi. The glass layers 24 and 32 are preferably of the crystallizing glass type composed, for example, of 71 percent PbO, 16 percent ZnO, 10 percent $B_2O_3$, 2 percent $SiO_2$, 1 percent $SnO_2$, which has a thermal coefficient of expansion between zero and 300° C of 6.8 to $7 \times 10^{-6}$ per degree centigrade, and a contraction coefficient between 450° and 25° C of $7.5 \times 10^{-6}$ per degree centigrade. Material for lead frame members 16 is preferably an alloy such as Alloy 42 comprising 41 percent nickel, 58.8 percent Fe, small percentage of Mn, Si, C, Cr, Co, P, S and Al, having a thermal coefficient of expansion of about $7 \times 10^{-6}$ per degree centigrade.

It is to be clearly understood that other materials may be used for the support 20, the bonding layer 22, and the lead frame elements 16, the foregoing being disclosed by way of example only.

When materials such as those disclosed above are used and when the lead frame leads are bonded to the ceramic package by the glass coating at about 450°, the metal contracts slightly faster than the ceramic covers and the glass, hence at all times retaining the ceramic covers and glass in lateral compression along the leads. This causes a pre-stress condition so that when the package is operated over the desired lower temperature range, for example up to a maximum of 125° C, no breaking of the glass seal or ceramic package will occur.

While the beams 14 are preferably between 0.0005 and 0.001 inches thick and 0.001 to 0.01 inches wide for a semiconductor chip 12 which is preferably between 0.002 and 0.010 inches thick, any desired different sets of dimensions may be used, if desired.

DESCRIPTION OF THE PREFERRED PROCESS FOR FORMING A PACKAGED BEAM LEAD SEMICONDUCTOR STRUCTURE

In order to form the device illustrated in FIGS. 1 and 2, a plurality of integrated circuits are formed in a single wafer by diffusion processes and epitaxial growth of semiconductor layers, in accordance with well-known practice, and beams are attached to the desired interconnecting and/or output lead regions of the semiconductor chips by plating, vapor deposition or any other desired method. The chips are then preferably separated from the wafer by supporting the wafer from the side containing the beams and semiconductor elements, masking regions to be retained as the chips and preferentially etching the intermediate regions to form the sloped edge walls of the chip 12, exposing the portions of the beams overhanging the edges of the chip 12. The edge walls preferably lie in the [111] crystallographic plane of the silicon semiconductor and, hence, form obtuse angles with the beam leads 14 which are parallel to the surface of chip 12 containing the active elements, said surface preferably lying in the [100] crystallographic plane of the semiconductor.

To package the chip 12, a lead frame 13 is formed of sheet metal, preferably around 10 mils thick, having inwardly extending leads 16 whose tips 18 for a distance of about two-tenths of an inch are reduced in thickness to about 4 or 5 mils by mask etching or, alternatively, by coining in a die which also stamps out the lead frame. The lead frame is then placed in a bonding machine such as that shown in U.S. Pat. No. 3,747,829, and the beam leads 14 of chip 12 are bonded directly to the ends 18 of lead frame leads 16.

Preferably, lead frame leads 16 are contacted about halfway between the frame 13 and their inner ends 18 by a spring clip 23 which urges the leads 16 downwardly against the base support 25 of the bonding machine which frictionally engages the lower surfaces of leads 16 so that the inner ends 18 do not move laterally during the bonding process. The chip is wobble bonded to the lead frame.

The lead frame has been previously prepared with a nickel coating 20 to 50 microns thick which acts as a barrier to any of the materials in the lead frames, particularly ion, and a gold coating preferably on the order of 100 microns thick, which is 99.99 percent pure and has a hardness between 60 and 90 knoop. This is preferably the same hardness range as the beams of the chip which are also substantially entirely formed of gold.

To bond the chip to the leads, the chip 12 is positioned with the beams 10 on the lower surface thereof in registry with the ends 18 of leads 16 so that each of the beams 14 contacts one of the thinned end portions 18, as shown in FIG. 4. Alignment may be done visually since the beams 14 extend beyond the ends of the chip 12. During this step the chip is preferably held in a bonding tool 19 by a vacuum produced through duct 21. Leads 16 attached to lead frame 13 are urged against a ceramic bonding machine jig portion 25 by spring clips (illustrated diagrammatically at 23) such that frictional engagement of leads 16 with jig 25 prevents lateral movement and, hence, misalignment during bonding.

As shown in FIG. 4, bonding tool 19 surrounds the chip 12 during the bonding process and applies pressure sequentially to adjacent beams 14 by wobbling the bonding head urging the beams against end 18 of the lead 16. Simultaneously, heat is applied at the interface between the beam leads 14 and the thin regions 18 by flowing current through these regions to raise the regions to a temperature of around 400° C. The pressure required between the tool used as the bonding head and the leads is in the range of 1 to 5 pounds, depending on the sequence in which pressure is applied to the leads and the temperature produced by flowing the current through the bonding regions. Preferably, a series of wobbles of the tool is made to produce several bonding regions between each of the beams 14 and the thinned regions 18, as more particularly described in said patent. In general, sufficient pressure is applied to produce some deformation of the beam leads 14.

Covers 20 and 26 of the package which are preformed with identical shapes have one side of each sprayed with the glass coatings 24 and 32 as glass powder in a conventional liquid binder. The coating 24 on the base cover 20 is preferably between 3 and 3½ mils thick, and the coating 34 on the top cover 26 is preferably 12 to 14 mils thick. The base and cover are then firmly clamped on the lead frame, and the assembly is heated to approximately 450° for approximately 15 minutes and allowed to cool. The glass powder binder vaporizes leaving coatings 24 and 32 which are preferably any well-known low fusing temperature crystallizing glass so that a firm bond adheres both to the gold of the lead frame leads 16 and the alumina covers 20 and 26. Glass layers 24 and 32 seal to each other between leads 16 to completely seal the package.

The 450° heat cycle is preferably accomplished in an inert atmosphere such as nitrogen so that the resulting gas entrapped in the capsule is inert. The entire lower surfaces of the leads 16 inside the capsule have now become bonded to the cover 20 by the glass layer 24. Accordingly, upon completion the device has the thinned lead portions 18 rigidly supported by cover 20 so that the structure in which the chip 12 which is supported substantially entirely through the beam leads 14 to the thinned end portion 18 of the leads 16 is rigidly supported by cover 20 and, hence, the chip 12 may be subjected to substantial shock or vibration without damage. In addition, since the entire assembly expands and contracts at substantially the same rate, no substantial stresses are formed at the region of the bonds between the thinned ends 18 of the lead-ins and the beam leads. Thus, the device may be utilized over a wide range of temperatures.

Because the lead frame leads 16 are prewelded to the beam leads 14 and because the layers of glass 24 and 32 on the covers 20 and 26 are sufficient to fill the regions between the lead members, critical alignment of the frame with respect to the covers is not required. Rather, the parts may be simply assembled in a boat and passed through the furnace since thermal expansion and contraction of the parts, which may cause some slight shifting of the beam lead frame with respect to the covers, will have no substantial deleterious effect on the final product. Accordingly, because no microaccuracy jigging is required during high temperature processing, the device may be made relatively inexpensively. In addition, because the substrate to which a beam lead device is normally attached has been eliminated, cost reduction of this stage of processing has been eliminated, and since there is only one set of bonds in series between the conductor forming the lead pin for the socket and the beams, possibility of failure of the device by opening of a bonded junction is reduced. Thus, the production yield achieved by the use of devices in which only one set of bonds is required between the chip and the socket may be substantially increased. Since the beam lead structure is visible during the process of bonding to the lead frame lead because the beam leads extend beyond the edges of the chip and because on the bottom the lead frame is openwork, the bonds may be visually inspected from all sides after the bonding operation to determine that all of the bonds are satisfactory. Alternatively, optical structures may be used to measure the bonding temperature, in accordance with well-known practice, to assist in automatically producing optimum bonding conditions. In addition, because the lead frame can be accurately jigged in the bonding frame, the process of bonding the chip to the lead frame may be done substantially automatically, thereby reducing labor cost. Also, since the spraying of glass and the assembly of the cap and base are low accuracy operations, these may also be done substantially automatically. As a result, the beam lead devices may be produced relatively economically compared with flip-chip devices or thermal compression bonding with individual wire leads between chip bonding pads and a substrate.

This completes the description of the package illustrated as an embodiment of this invention and the process of forming the same. However, many modifications of this invention will be apparent to persons skilled in the art without departing from the spirit and scope of this invention. For example, structures other than the planar lead frame member may be used as lead-ins, the members 16 could extend vertically up through apertures in the bottom of the case 26 terminating in planar surfaces, a plurality of different semiconductor chips could be supported in the same package, and one or more of the lead-ins 16 could extend completely across the region beneath the chip 12 to provide for better alignment of the chip 12 in the package. In addition, the chip 12 need not necessarily be formed entirely of semiconductor material but, for example, could be a plurality of individual semiconductor regions formed in an epitaxial layer of semiconductor material supported on an insulating substrate such as the line of semiconductor integrated circuits on sapphire substrates. Accordingly, it is contemplated that this invention be not limited to the particular details of the embodiments disclosed herein except as defined by the appended claims.

What is claimed is:

1. A semiconductor package comprising:
a rigid insulating support;
(b) a lead frame having a plurality of leads disposed in a plane, such lead frame being disposed on and bonded to the insulating support, each one of the plurality of leads having an end portion which extends beyond the edge of said insulating support to form a pin for insertion into an integrated circuit socket and another end portion which is thinner than the major portion of said lead, such thinner end portion being supported on the insulating support; and
(c) a semiconductor device having at least one active semiconductor element and having single, planar, beam lead conductive members of substantially uniform thickness extending beyond the edges of said device, such planar beam lead conductive members being disposed in the plane of the plurality of leads and being supported on and bonded directly to the thinner end portion of said leads.

2. The semiconductor package according to claim 1 wherein the thermal coefficient of expansion of the lead frame is substantially the same as the thermal coefficient of expansion of the insulating support.

3. The semiconductor package according to claim 2 wherein said semiconductor device comprises a beam lead structure.

4. The semiconductor package according to claim 1 wherein said support comprises an alumina body having a planar surface bonded to the thinner ends of said leads.

5. The semiconductor package according to claim 4 wherein leads from said semiconductor structure are bonded to said leads of said package adjacent said planar surface.

* * * * *